United States Patent
Kuo

(10) Patent No.: US 12,087,593 B2
(45) Date of Patent: Sep. 10, 2024

(54) METHOD OF PLASMA ETCHING

(71) Applicant: NANYA TECHNOLOGY CORPORATION, New Taipei (TW)

(72) Inventor: Shih Pin Kuo, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 300 days.

(21) Appl. No.: 17/806,944

(22) Filed: Jun. 15, 2022

(65) Prior Publication Data

US 2023/0411164 A1    Dec. 21, 2023

(51) Int. Cl.
*H01L 21/311* (2006.01)
*H01L 21/02* (2006.01)
*H01L 21/67* (2006.01)

(52) U.S. Cl.
CPC .... *H01L 21/31116* (2013.01); *H01L 21/0212* (2013.01); *H01L 21/0217* (2013.01); *H01L 21/6708* (2013.01)

(58) Field of Classification Search
None
See application file for complete search history.

(56) References Cited

U.S. PATENT DOCUMENTS

| | | | |
|---|---|---|---|
| 2016/0181116 A1* | 6/2016 | Berry, III | H01L 21/67069 438/715 |
| 2017/0178921 A1* | 6/2017 | Takeda | H01L 21/02164 |
| 2020/0321219 A1* | 10/2020 | Gohira | H01L 21/31116 |
| 2021/0175089 A1* | 6/2021 | Nishihara | H01L 21/6708 |
| 2021/0233774 A1* | 7/2021 | Kato | C09K 13/00 |
| 2021/0296134 A1* | 9/2021 | Hosoya | H01L 21/02263 |
| 2022/0059360 A1* | 2/2022 | Gohira | H01L 21/32137 |
| 2022/0319860 A1* | 10/2022 | Nakagawa | H01J 37/32449 |

* cited by examiner

*Primary Examiner* — Binh X Tran
(74) *Attorney, Agent, or Firm* — CKC & Partners Co., LLC

(57) ABSTRACT

The present disclosure provides a method of plasma etching including the following operations. A wafer and a nitride layer disposed on the wafer are received. An annular conduit is disposed above an edge portion of the nitride layer, in which the annular conduit has a plurality of holes facing the edge portion of the nitride layer. A plasma is sprayed onto an upper surface of the nitride layer. An unsaturated fluorocarbon is sprayed from the holes of the annular conduit to the edge portion of the nitride layer.

15 Claims, 4 Drawing Sheets

METHOD OF PLASMA ETCHING

BACKGROUND

Field of Invention

The present disclosure relates to a method of plasma etching.

Description of Related Art

During the etching process of the semiconductor industry, inside the etching chamber, the wafer is placed in the center of the electrostatic chuck (ESC) with the help of the focus ring outside the edge of the wafer. In the case of the wafer being in the center of the electrostatic chuck, the concentration of the etching gas is distributed uniformly on the wafer. Therefore, the etching rate is consistent over the wafer, which leads to the materials on the wafer can be etched uniformly. However, as the etching time increases, the focus ring is damaged by the etching gas as well. When the focus ring fails to keep the wafer in the center of the electrostatic chuck, the distribution of the etching gas is uneven on the wafer. It leads to the replacement of the focus ring and therefore causes lower throughput and waste. Because the non-uniformity is usually more profound on the edge of the wafer because of the discontinuity of the topography. Therefore, it is necessary to solve the non-uniformity etching of the materials on the edge of the wafer, which prolongs the use of the focus ring.

SUMMARY

The present disclosure provides a method of plasma etching including the following operations. A wafer and a nitride layer disposed on the wafer are received. An annular conduit is disposed above an edge portion of the nitride layer, in which the annular conduit has a plurality of holes facing the edge portion of the nitride layer. A plasma is sprayed onto an upper surface of the nitride layer. An unsaturated fluorocarbon is sprayed from the holes of the annular conduit to the edge portion of the nitride layer.

In one or more embodiments of the present disclosure, the unsaturated fluorocarbon is a gas.

In one or more embodiments of the present disclosure, the unsaturated fluorocarbon includes hexafluorobutadiene.

In one or more embodiments of the present disclosure, the method further includes polymerizing the unsaturated fluorocarbon to form a polymer on the edge portion of the nitride layer, in which the polymerizing the unsaturated fluorocarbon is induced by the plasma.

In one or more embodiments of the present disclosure, spraying the unsaturated fluorocarbon from the holes of the annular conduit includes spraying the unsaturated fluorocarbon with a first flow rate between 0.1 SCCM and 1.2 SCCM.

In one or more embodiments of the present disclosure, the first flow rate is between 0.2 SCCM and 0.4 SCCM.

In one or more embodiments of the present disclosure, spraying the unsaturated fluorocarbon from the holes of the annular conduit includes spraying the unsaturated fluorocarbon with a first flow rate and adjusting the first flow rate to a second flow rate greater than the first flow rate after an etching time.

In one or more embodiments of the present disclosure, the second flow rate is between 0.8 SCCM and 3.2 SCCM.

In one or more embodiments of the present disclosure, the second flow rate is between 0.9 SCCM and 1.1 SCCM.

In one or more embodiments of the present disclosure, the etching time is between 250 hours and 350 hours.

In one or more embodiments of the present disclosure, the edge portion of the nitride layer has a width between 3 mm and 5 mm from an edge of the nitride layer.

In one or more embodiments of the present disclosure, the holes surround the edge portion of the nitride layer in a top view.

In one or more embodiments of the present disclosure, a direction of spraying the unsaturated fluorocarbon is substantially vertical to the upper surface of the nitride layer.

In one or more embodiments of the present disclosure, the plasma includes tetrafluoromethane, difluoromethane, oxygen, or combinations thereof.

In one or more embodiments of the present disclosure, the nitride layer includes silicon nitride.

It is to be understood that both the foregoing general description and the following detailed description are by examples and are intended to provide further explanation of the present disclosure as claimed.

BRIEF DESCRIPTION OF THE DRAWINGS

Aspects of the present disclosure are best understood from the following detailed description when read with the accompanying drawings. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
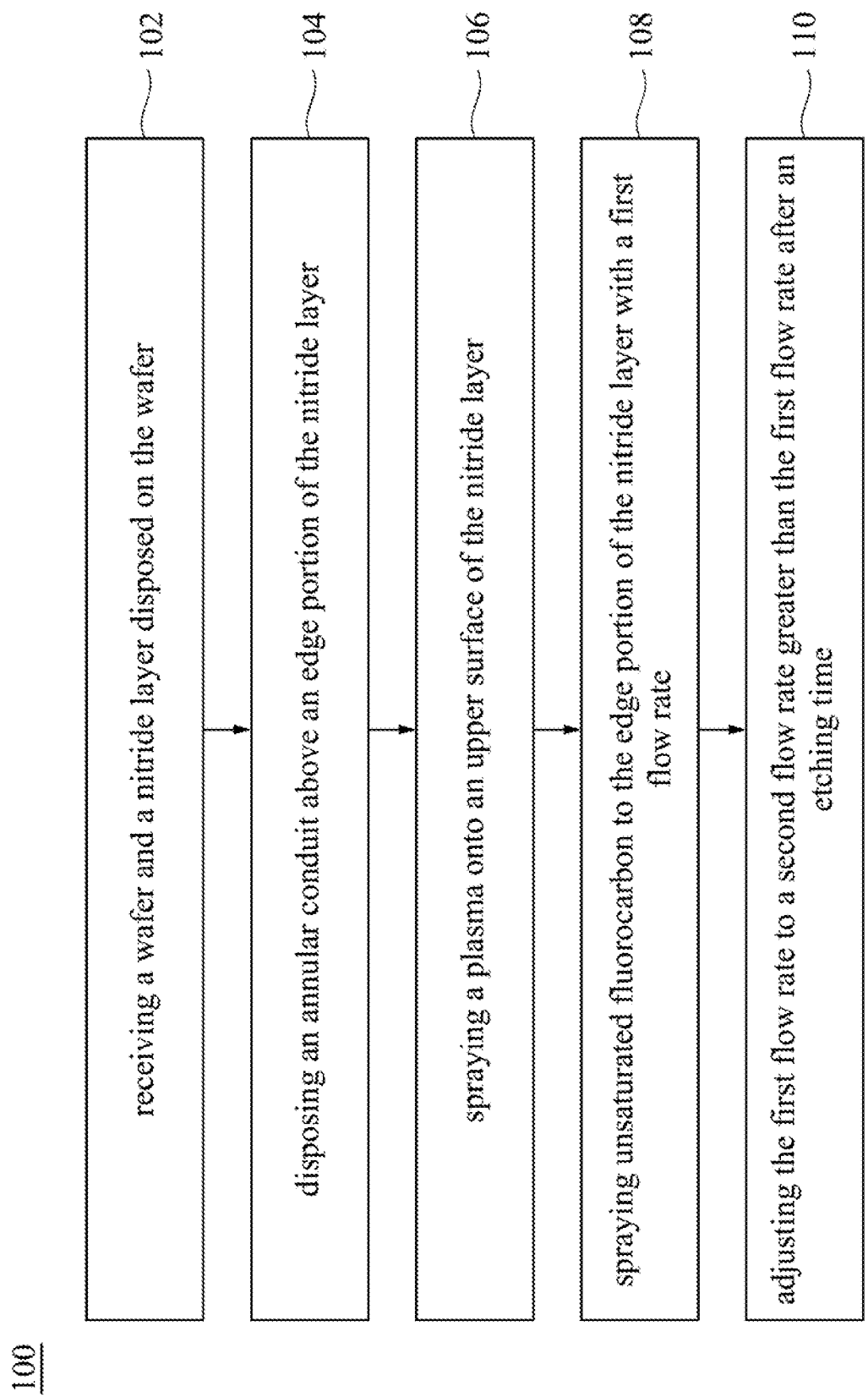
FIG. 1 illustrates a flow chart of a method of plasma etching, in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same reference numeral in different figures refers to the same or similar component formed by a same or similar method using a same or similar material(s).

The present disclosure provides a method of plasma etching including the following operations. A wafer and a nitride layer disposed on the wafer are received. An annular conduit is disposed above an edge portion of the nitride layer, in which the annular conduit has a plurality of holes facing the edge portion of the nitride layer. A plasma is sprayed onto an upper surface of the nitride layer. An unsaturated fluorocarbon is sprayed from the holes of the annular conduit to the edge portion of the nitride layer. The method of plasma etching of the present disclosure can prevent the problem of the non-uniformity plasma etching of the nitride layer, especially the edge portion of the nitride layer. The details of the present disclosure are illustrated with embodiments below.

Figure 2:
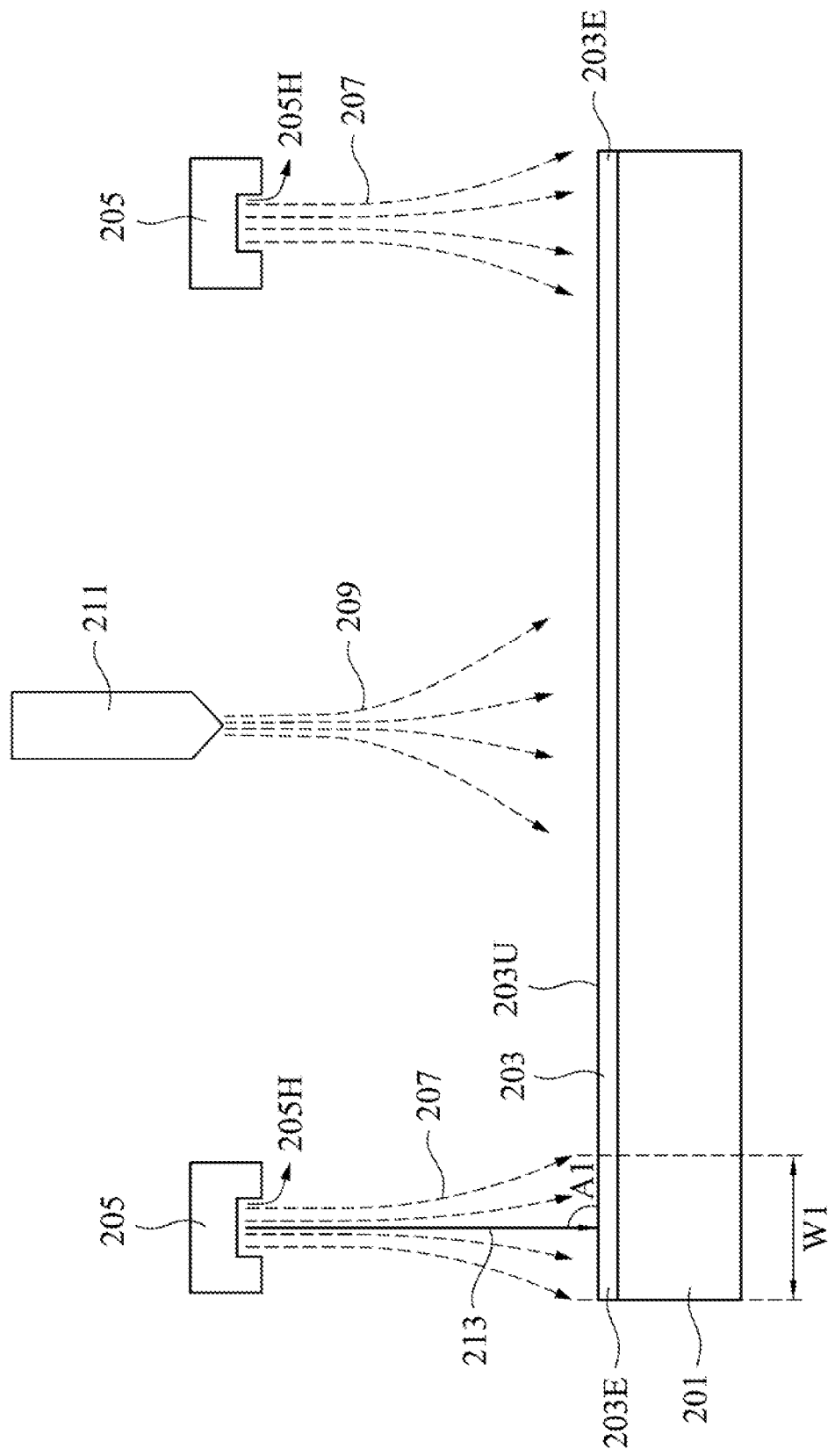
FIG. 2 illustrates a cross-sectional view of a plasma etching device, a wafer, and a nitride layer, in accordance with some embodiments of the present disclosure.
Figure 3:
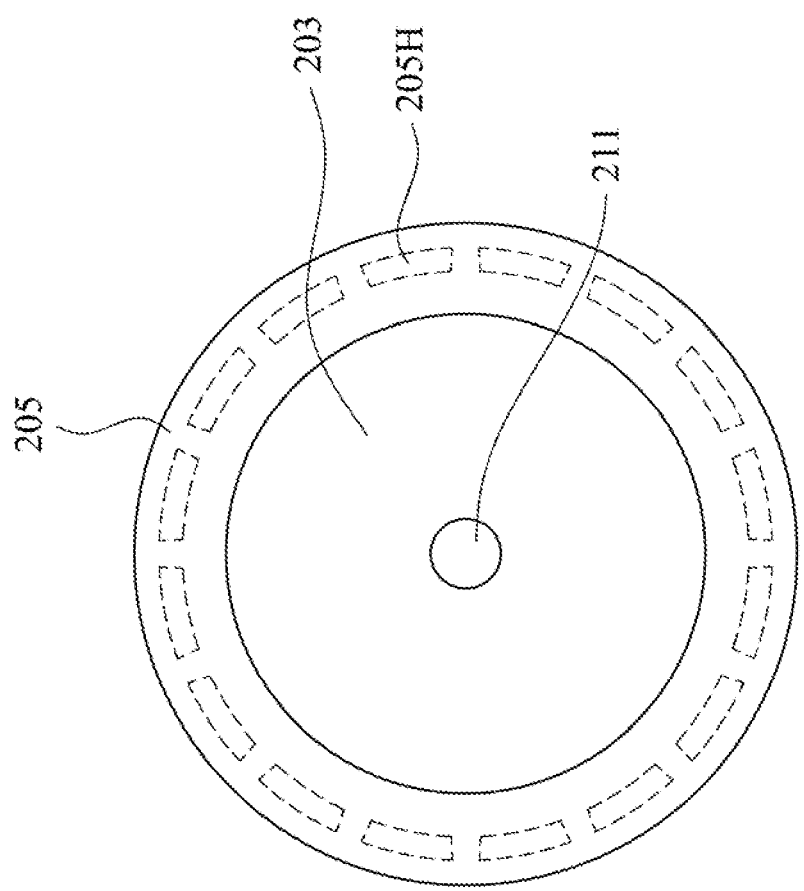
FIG. 3 illustrates a top view of a plasma etching device and a nitride layer, in accordance with some embodiments of the present disclosure.

FIG. 1 illustrates a flow chart of a method 100 of plasma etching, in accordance with some embodiments of the present disclosure. To better understand the method of plasma etching of the present disclosure, as shown in FIG. 1, please also refer to FIG. 2 and FIG. 3, when reading FIG. 1. FIG. 2 illustrates a cross-sectional view of a plasma etching device, a wafer, and a nitride layer, in accordance with some embodiments of the present disclosure. The plasma etching device includes an annular conduit and an inlet discussed in detail later. FIG. 3 illustrates a top view of the plasma etching device and the nitride layer in FIG. 2, in accordance with some embodiments of the present disclosure.

Please refer to FIG. 1 and FIG. 2 simultaneously. Operation 102 in the method 100 of plasma etching, as shown in FIG. 1, is receiving a wafer 201 and a nitride layer 203 disposed on the wafer 201, as shown in FIG. 2. In some embodiments, the wafer 201 includes but is not limited to the silicon wafer, the silicon carbide wafer, the gallium nitride wafer, and so on. In some embodiments, the nitride layer 203 includes silicon nitride, for example, $Si_3N_4$. In some embodiments, the nitride layer 203, including silicon nitride, is an insulating layer. The nitride layer 203 of the present disclosure is applicable to be a functional layer in, for example, dynamic random-access memory (DRAM) in some embodiments. In some embodiments, the nitride layer 203 is formed but not limited by chemical vapor deposition (CVD), plasma-enhanced chemical vapor deposition (PECVD), or low-pressure chemical vapor deposition (LPCVD). In some embodiments, the nitride layer 203 is formed to cover the whole upper surface of the wafer 201, as shown in FIG. 2 and FIG. 3.

Next, operation 104 in the method 100 of plasma etching, as shown in FIG. 1, is disposing an annular conduit 205 above an edge portion 203E of the nitride layer 203, as shown in FIG. 2 and FIG. 3. Referring to FIG. 2 and FIG. 3, the annular conduit 205, having a plurality of holes 205H that face the edge portion 203E of the nitride layer 203, is disposed above the edge portion 203E of the nitride layer 203. The annular conduit 205 is a conduit that used for spraying out an unsaturated fluorocarbon 207, which will be discussed later in operation 108. For example, more specifically, the unsaturated fluorocarbon 207 is injected from an inlet (not shown) of the annular conduit 205 into the annular conduit 205 and then sprayed out from the holes 205H of the annular conduit 205 to the edge portion 203E of the nitride layer 203. In some embodiments, the edge portion 203E of the nitride layer 203 is defined as an area with a width W1 between 3 mm and 5 mm from the edge of the nitride layer 203. In some embodiments, as shown in FIG. 3, the edge portion 203E has an annular shape that substantially overlaps with the annular conduit 205. In the embodiments that the nitride layer 203 is formed to cover the whole upper surface of the wafer 201, as shown in FIG. 2 and FIG. 3, the edge portion 203E of the nitride layer 203, in the top view of FIG. 3, also overlaps with the edge of the wafer 201. To spray the unsaturated fluorocarbon 207 to the edge portion 203E of the nitride layer 203, the holes 205H is designed to face the edge portion 203E of the nitride layer 203 and surround and overlap with the edge portion 203E of the nitride layer 203 as shown in FIG. 3. It is noted that the number of holes 205H in FIG. 3 is illustrative. Any applicable number is intended to be included in the present disclosure.

Next, operation 106 in the method 100 of plasma etching, as shown in FIG. 1, is spraying a plasma 209 onto an upper surface 203U of the nitride layer 203, as shown in FIG. 2. Referring to FIG. 2 and FIG. 3, an inlet 211 is disposed above the upper surface 203U of the nitride layer 203 and is used to inject the plasma 209 and spray the plasma 209 onto the whole upper surface 203U of the nitride layer 203. It is noted that the shape and the size of the inlet 211 in FIG. 2 and FIG. 3 are illustrative. Any shape and size of the inlet 211 are intended to be included in the present disclosure. For example, in some embodiments, the inlet 211 has a showerhead shape and the size of the inlet 211 is larger to cover the upper surface 203U of the nitride layer 203. In some embodiments, the plasma 209 is Radiofrequency (RF) plasma with frequency between 1 MHz and 100 MHz and includes tetrafluoromethane ($CF_4$), difluoromethane ($CH_2F_2$), oxygen ($O_2$), or combinations thereof. In some embodiments, because the nitride layer 203 is placed in the center of the magnetic field generated by, for example, the magnet (not illustrated in FIG. 2 and FIG. 3) disposed underneath the wafer 201, the spray of the plasma 209 onto the upper surface 203U of the nitride layer 203 leads to a uniform dispersion of the plasma 209 on the nitride layer 203, which furthermore results into a uniform etching to the nitride layer 203. In other words, the positional alignment of the spray of the plasma 209 and the nitride layer 203 is significant to keep the etching uniform. However, as the etching time increases, the alignment might miss. For example, the focus ring (not illustrated in FIG. 2 and FIG. 3) that holds the nitride layer 203 in the center of the magnetic field may be bombarded by the plasma 209, which causes damage to the focus ring and therefore fails to keep the nitride layer 203 in the aligned position. In such cases, the non-uniform etching on the edge portion 203E of the nitride layer 203 is significant owing to the discontinuity nature of the edge, for example, causing a greater etching rate on the edge portion 203E of the nitride layer 203. In some embodiments, the plasma 209 is removed from the etching chamber (not shown) by a vacuum pump (not shown).

Next, operation 108 in the method 100 of plasma etching, as shown in FIG. 1, is spraying an unsaturated fluorocarbon 207 to the edge portion 203E of the nitride layer 203 with a first flow rate, as shown in FIG. 2. In some embodiments, operation 106 and operation 108 are performed at the same time. Referring FIG. 2 and FIG. 3, as mentioned above, the unsaturated fluorocarbon 207 is sprayed out from the holes 205H of the annular conduit 205 to the edge portion 203E of the nitride layer 203. A direction 213 of spraying the unsaturated fluorocarbon 207 from the holes 205H of the annular conduit 205 to the edge portion 203E of the nitride layer 203 is substantially vertical to an upper surface 203U of the nitride layer 203. That is, the angle A1 between the direction 213 of spraying and the upper surface 203U of the nitride layer 203 is substantially equal to 90°. In other embodiments, the angle A1 is 85°-95°. The unsaturated fluorocarbon 207 is a gas and does not form plasma in the plasma etching device 200 in FIG. 2 and FIG. 3. In some embodiments, the unsaturated fluorocarbon 207 includes hexafluorobutadiene ($C_4F_6$). Because the unsaturated fluorocarbon 207 has unsaturated bonds, it may polymerize to form a polymer (not illustrated in FIG. 2 and FIG. 3), which is induced by the plasma 209. The polymer may deposit on the edge portion 203E of the nitride layer 203 and act as protection to reduce the local concentration of the plasma 209 on the edge portion 203E. In other words, the polymer formed from the unsaturated fluorocarbon 207 decreases the etching rate of the edge portion 203E of the nitride layer 203. In some embodiments, to make the nitride layer 203 be uniformly etched, the unsaturated fluorocarbon 207 is sprayed with a first flow rate between 0.1 SCCM and 1.2 SCCM onto the edge portion 203E of the nitride layer 203, more preferably between 0.2 SCCM and 0.4 SCCM. If the first flow rate is lower than 0.1 SCCM, the first flow rate may lead to a greater etching rate on the edge portion 203E of the nitride layer 203, which is not desirable because of poor uniformity. If the first flow rate is higher than 1.2 SCCM, the first flow rate may lead to a lower etching rate on the edge portion 203E of the nitride layer 203, which is not desirable because of poor uniformity. In some embodiments, the unsaturated fluorocarbon 207 is removed from the etching chamber (not shown) by a vacuum pump (not shown).

Next, operation 110 in the method 100 of plasma etching, as shown in FIG. 1, is adjusting the first flow rate to a second flow rate greater than the first flow rate after an etching time. The above has illustrated that the non-uniform etching of the edge portion 203E of the nitride layer 203 increases as the etching time increases. Therefore, it is necessary to increase the flow rate, for example, adjusting the first flow rate to be a second flow rate that is greater after etching for an etching time. The greater second flow rate compensates for the increase in the etching rate of the edge portion 203E of the nitride layer 203. In some embodiments, the etching time is between 250 hours and 350 hours. The second flow rate is between 0.8 SCCM and 3.2 SCCM, more preferably between 0.9 SCCM and 1.1 SCCM. If the second flow rate is lower than 0.8 SCCM, the second flow rate may lead to a greater etching rate on the edge portion 203E of the nitride layer 203, which is not desirable because of poor uniformity. If the second flow rate is higher than 3.2 SCCM, the second flow rate may lead to a lower etching rate on the edge portion 203E of the nitride layer 203, which is not desirable because of poor uniformity.

The above provides an illustrative description of the present disclosure. To fully understand the present disclosure, the below provides embodiments to illustrate the detail. The intention is to cover more aspects of the present disclosure but not limit the present disclosure.

Experiment 1: Comparison Between Spraying the Unsaturated Fluorocarbon and Without Spraying the Unsaturated Fluorocarbon In each Embodiment 1 and Comparative Embodiment 1, etching depths of 12 etching points, evenly distributed on the edge portion 203E of the nitride layer 203, were measured. The definition of the edge portion 203E of the nitride layer 203 is illustrated in FIG. 2 and FIG. 3, referring to the above description. Therefore, the 12 etching points substantially divide the edge portion 203E of the nitride layer 203 into 12 areas with measured etching depths representing the local etching depth. The difference between Embodiment 1 and Comparative Embodiment 1 is that Embodiment 1 adopted operation 102 to operation 108 in the method 100 of plasma etching of the present disclosure, as shown in FIG. 1, but Comparative Embodiment 1 only includes operation 102 and operation 106. In other words, Comparative Embodiment 1 did not have an unsaturated fluorocarbon spraying to the edge portion 203E of the nitride layer 203, as shown in FIG. 2 and FIG. 3, but Embodiment 1 had. The rest of the operations, such as operation 102 and operation 106, were substantially the same for Embodiment 1 and Comparative Embodiment 1. For example, the plasma 209 was the combination of tetrafluoromethane and oxygen with a frequency of 13.56 MHz and the nitride layer 203 was $Si_3N_4$. After etching for the same hours, the 12 etching depths in Comparative Embodiment 1 were 68.6 nm, 69.9 nm, 69.0 nm, 68.6 nm, 68.3 nm, 68.3 nm, 68.2 nm, 68.0 nm, 68.1 nm, 67.9 nm, 67.7 nm, 67.6 nm, 68.3 nm, 68.4 nm, 68.9 nm, 68.7 nm, 68.2 nm, 68.4 nm, 68.6 nm, 68.4 nm, 68.6 nm, 69.5 nm, 69.8 nm, and 69.3 nm. However, the 12 etching depths in Embodiment 1 were 55.0 nm, 55.7 nm, 56.1 nm, 55.6 nm, 55.6 nm, 55.6 nm, 55.5 nm, 55.6 nm, 55.6 nm, 55.2 nm, 55.3 nm, 55.0 nm, 55.5 nm, 55.6 nm, 55.7 nm, 55.2 nm, 54.9 nm, 54.6 nm, 54.7 nm, 54.7 nm, 55.1 nm, 55.8 nm, 56.3 nm, and 55.7 nm. Lower etching depths were measured in Embodiment 1, which suggests a lower etching rate when applying the spray of the unsaturated fluorocarbon onto the edge portion 203E of the nitride layer 203. In Embodiment 1, the first flow rate was 0.5 SCCM. Table I summarizes the average of the 12 etching depths in Embodiment 1 and Comparative Embodiment 1.

TABLE 1

| | Average Etching Depth (nm) |
|---|---|
| Comparative Embodiment 1 | 68.5 |
| Embodiment 1 | 55.4 |

Experiment 2: Comparison Between Different First Flow Rate

In Embodiment 2, Embodiment 3 and Embodiment 4, operation 102 to operation 108 in method 100 of plasma etching of the present disclosure, as shown in FIG. 1, were adopted. The difference between Embodiment 2, Embodiment 3, and Embodiment 4 is different first flow rates. In Embodiment 2, the first flow rate was 1 SCCM. In Embodiment 3, the first flow rate was 0.5 SCCM. In Embodiment 4, the first flow rate was 0.3 SCCM. The rest experimental conditions were substantially the same. For example, the plasma 209 was the combination of tetrafluoromethane and oxygen with a frequency of 13.56 MHz and the nitride layer 203 was $Si_3N_4$. To study the etching uniformity, the thickness of the nitride layer 203, shown in FIG. 2 and FIG. 3, was measured and the results were summarized in Table 2 below. In Table 2, the average thickness shows the average of the measured thickness. The range is the difference between the maximum measured thickness and the minimum measured thickness. The standard deviation is the standard deviation of the measured thickness. After etching for 150 hours with the first flow rate of Embodiment 2, Embodiment 3, and Embodiment 4 being 1 SCCM, 0.5 SCCM, and 0.3 SCCM, Embodiment 4 had a preferable range and standard deviation. The smaller range and smaller standard deviation suggest better uniformity in Embodiment 4.

TABLE 2

|  | Embodiment 2 | Embodiment 3 | Embodiment 4 |
|---|---|---|---|
| Average Thickness (Å) | 107.7 | 104.2 | 104.1 |
| Range (Å) | 94.1 | 88.7 | 70.0 |
| Standard Deviation (Å) | 24.4 | 19.5 | 14.7 |

Experiment 3: Comparison Between Different Second Flow Rate

Figure 4:
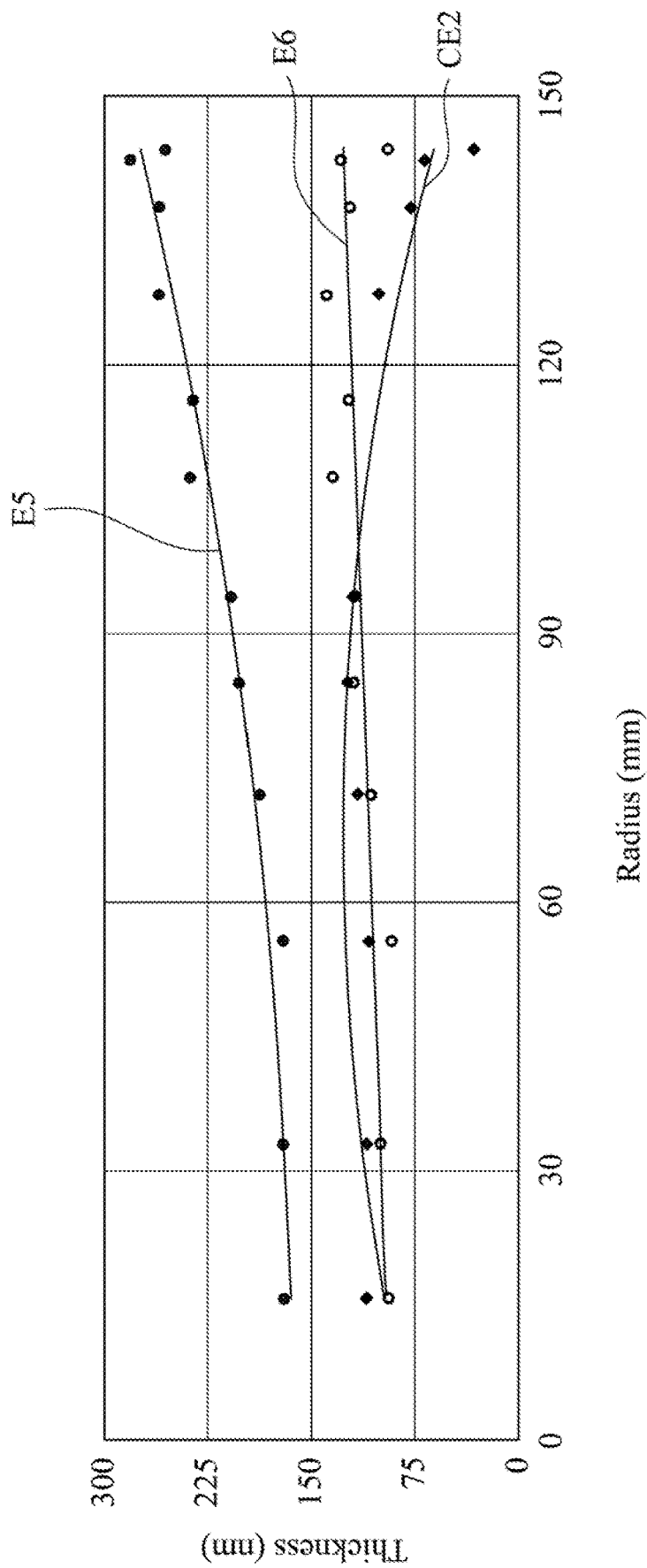
FIG. 4 illustrates a curve chart with the thickness of a nitride layer changing with the radius of the nitride layer, in accordance with some embodiments of the present disclosure.

As mentioned above, after etching for a time, the first flow rate can be adjusted to a second flow rate that is greater than the first flow rate in order to compensate for the increase of the etching rate on the edge portion 203E of the nitride layer 203, as shown in FIG. 2 and FIG. 3. In Embodiment 5 and Embodiment 6, operation 102 to operation 110 in method 100 of plasma etching of the present disclosure, as shown in FIG. 1, were adopted. The difference between Embodiment 5 and Embodiment 6 is different second flow rates. The rest were substantially the same, for example, the same 0.3 SCCM first flow rate. In Embodiment 5, the second flow rate is 3 SCCM. In Embodiment 6, the second flow rate is 1 SCCM. Compared to Embodiment 5 and Embodiment 6, Comparative Embodiment 2 adopted only operation 102 and operation 106. Comparative Embodiment 2 did not have an unsaturated fluorocarbon spraying to the edge portion 203E of the nitride layer 203. The rest experimental conditions were substantially the same for Embodiment 5, Embodiment 6, and Comparative Embodiment 2. For example, the plasma 209 was the combination of tetrafluoromethane and oxygen with a frequency of 13.56 MHz and the nitride layer 203 was $Si_3N_4$. Table 3 summarizes the result obtained from Embodiment 5, Embodiment 6, and Comparative Embodiment 2. The average thickness is the average of the measured thicknesses of the nitride layer 203. The maximum and the minimum thicknesses are the maxima and the minimum among the measured thicknesses. The range is the difference between the maxima and the minimum. The standard deviation is the standard deviation of the measured thicknesses. After etching for 300 hours with the second flow rate of Embodiment 5 and Embodiment 6 being 3 SCCM and 1 SCCM, Embodiment 6 had a preferable range and standard deviation. The smaller range and smaller standard deviation suggest better uniformity in Embodiment 6. Moreover, in FIG. 4, the thickness of the nitride layer 203 changing with the radius of the nitride layer 203 was summarized as a curve chart. In FIG. 4, the thickness of the nitride layer 203 in Comparative Embodiment 2, indicated as curve CE2, decreases as the radius of the nitride layer 203 increases. That is, the etching rate is enhanced on the edge portion 203E. However, when an unsaturated fluorocarbon was used to spray to the edge portion 203E of the nitride layer 203, the etching rate on the edge portion 203E decreased, as shown in curve E5 of Embodiment 5 and curve E6 of Embodiment 6. Among Embodiment 5 and Embodiment 6, Embodiment 6 has a better uniformity because the change of the thickness with the increase of the radius is insignificant.

TABLE 3

|  | Embodiment 5 | Embodiment 6 | Comparative Embodiment 2 |
|---|---|---|---|
| Average Thickness (nm) | 220.2 | 113.8 | 99.6 |
| Maximum Thickness (nm) | 281.4 | 138.8 | 125.5 |
| Minimum Thickness (nm) | 169.7 | 91.0 | 31.5 |
| Range (nm) | 111.7 | 47.7 | 94 |
| Standard Deviation (nm) | 40.5 | 16.8 | 26.4 |

With the spraying of the unsaturated fluorocarbon 207 on the edge portion 203E of the nitride layer 203, the increase of the etching rate on the edge portion 203E can decrease and therefore obtaining uniform etching. The replacement cycle of the parts, such as the focus ring that holds the nitride layer 203 in the center of the etching, is prolonged as well. Without the frequent replacement of the parts, the waste is reduced and the etching throughput is improved.

Although the present disclosure has been described in considerable detail with reference to certain embodiments thereof, other embodiments are possible. Therefore, the spirit and scope of the appended claims should not be limited to the description of the embodiments contained herein.

It will be apparent to one skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A method of plasma etching, comprising:
   receiving a wafer and a nitride layer disposed on the wafer;
   disposing an annular conduit above an edge portion of the nitride layer, wherein the annular conduit has a plurality of holes facing the edge portion of the nitride layer;
   spraying a plasma onto an upper surface of the nitride layer; and
   spraying an unsaturated fluorocarbon from the holes of the annular conduit to the edge portion of the nitride layer.
2. The method of claim 1, wherein the unsaturated fluorocarbon is a gas.
3. The method of claim 1, wherein the unsaturated fluorocarbon comprises hexafluorobutadiene.
4. The method of claim 1, further comprising polymerizing the unsaturated fluorocarbon to form a polymer on the edge portion of the nitride layer, wherein the polymerizing the unsaturated fluorocarbon is induced by the plasma.
5. The method of claim 1, wherein the edge portion of the nitride layer has a width between 3 mm and 5 mm from an edge of the nitride layer.
6. The method of claim 1, wherein the holes surround the edge portion of the nitride layer in a top view.
7. The method of claim 1, wherein a direction of spraying the unsaturated fluorocarbon is substantially vertical to the upper surface of the nitride layer.
8. The method of claim 1, wherein the plasma comprises tetrafluoromethane, difluoromethane, oxygen, or combinations thereof.
9. The method of claim 1, wherein the nitride layer comprises silicon nitride.

10. The method of claim 1, wherein spraying the unsaturated fluorocarbon from the holes of the annular conduit comprises:
    spraying the unsaturated fluorocarbon with a first flow rate between 0.1 SCCM and 1.2 SCCM.

11. The method of claim 10, wherein the first flow rate is between 0.2 SCCM and 0.4 SCCM.

12. The method of claim 1, wherein spraying the unsaturated fluorocarbon from the holes of the annular conduit comprises:
    spraying the unsaturated fluorocarbon with a first flow rate; and
    adjusting the first flow rate to a second flow rate greater than the first flow rate after an etching time.

13. The method of claim 12, wherein the etching time is between 250 hours and 350 hours.

14. The method of claim 12, wherein the second flow rate is between 0.8 SCCM and 3.2 SCCM.

15. The method of claim 14, wherein the second flow rate is between 0.9 SCCM and 1.1 SCCM.

* * * * *